United States Patent [19]
Hsu et al.

[11] Patent Number: 5,970,807
[45] Date of Patent: *Oct. 26, 1999

[54] TWEEZER POSITION CHECKER

[75] Inventors: Hwa-Ching Hsu, Chu Tung Province; Wan-Lai Chen; Yi-Hsin Chen, both of Hsin-Chu, all of Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/703,255

[22] Filed: Aug. 26, 1996

[51] Int. Cl.[6] ............ G01M 19/00; G01B 5/16; G01D 21/00
[52] U.S. Cl. ............ 73/865.9; 73/865.8; 33/533; 33/645
[58] Field of Search ............ 73/1 R, 1 J, 865.8, 73/865.9; 33/545, 613, 645, 533, 567, 626, 642, 501.05, 501.6, 644

[56] References Cited

U.S. PATENT DOCUMENTS

| | | | |
|---|---|---|---|
| 3,730,595 | 5/1973 | Yakubowski | 302/2 R |
| 4,843,727 | 7/1989 | Struble | 33/613 |
| 4,887,474 | 12/1989 | Sargeant | 73/865.9 |
| 4,914,964 | 4/1990 | Speiser | 73/865.9 |
| 5,179,863 | 1/1993 | Uchida et al. | 73/865.8 |
| 5,195,729 | 3/1993 | Thomas et al. | 269/21 |
| 5,446,774 | 8/1995 | Russell et al. | 33/533 |
| 5,454,170 | 10/1995 | Cook | 33/645 |
| 5,485,759 | 1/1996 | Goff et al. | 73/865.9 |

*Primary Examiner*—Michael Brock
*Assistant Examiner*—Chad Soliz
*Attorney, Agent, or Firm*—George O. Saile; Stephen B. Ackerman

[57] ABSTRACT

A method and apparatus to gage the spacing between a plurality of handling elements used for transferring planar objects into and out of holding receptacles in a semiconductor process. The handling tweezers are moved to a checking location and fit interleaved with the gage apparatus. If the handling tweezers do not fit, the tweezers are moved to an accessible maintenance location for alignment and recalibration enabling its use for transferring semiconductor wafers to and from wafer holding receptacles in a chemical vapor deposition vertical diffusion furnace.

5 Claims, 6 Drawing Sheets

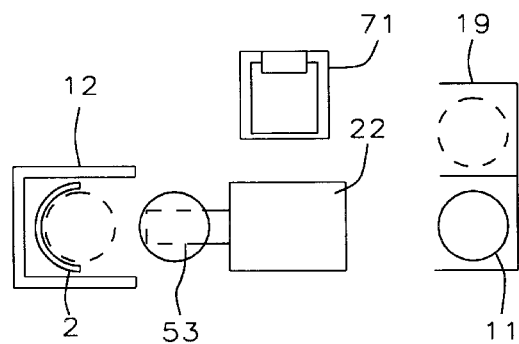
FIG. 6d
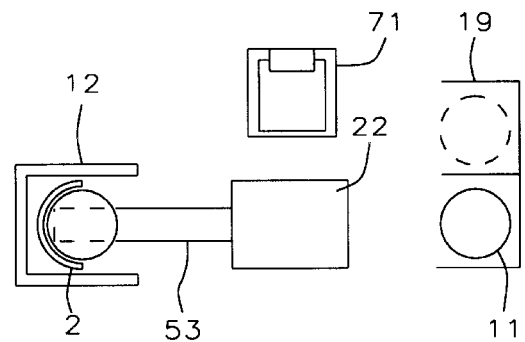
FIG. 6e
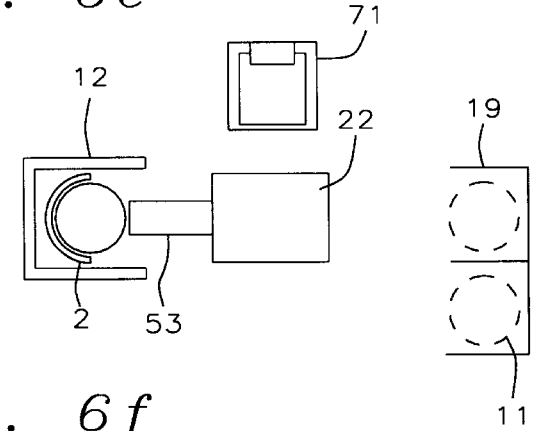
FIG. 6f
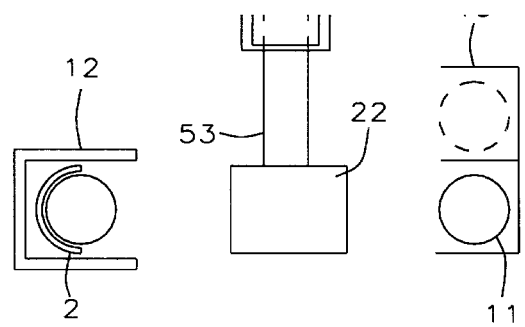

TWEEZER POSITION CHECKER

BACKGROUND OF THE INVENTION

(1) Technical Field

This invention relates generally to wafer transfer and handling apparatus and more particularly to a positioning gage that assures proper alignment between elements of the wafer transfer mechanism and the wafers being loaded to and from a vertical CVD/diffusion system in a semiconductor process.

(2) Description of the Prior Art

The following two documents relate to various methods dealing with handling of wafers during the production of semiconductor devices.

U.S. Pat. No. 3,730,595 issued May 1, 1973 to Carl Yakubowski discloses a wafer transfer and handling apparatus having an indexable carrier for transferring wafers to and from work stations.

U.S. Pat. No. 5,195,729 issued Mar. 23, 1993 to Michael E. Thomas et al discloses a carrier for a semiconductor wafer or other substrate has an outer portion adapted for engagement by equipment for processing wafers.

The manufacturing process of semiconductor wafers generally includes a CVD(Chemical Vapor Depostion)/diffusion treatment step in a CVD/diffusion furnace. A vertical CVD/diffusion furnace conventionally has a firing receptacle for wafers, a wafer handling apparatus and a supply of wafers arranged and stored in cassette compartments. Wafers must be removed and replaced many times during this process. With the existance of high throughput automatic process equipment, automatic wafer handling is most essential. Indexing of the elevator to the proper cassette address, the retrieval and transfer of wafers from the storage compartment into the firing receptacle of the furnace and conversely, requires precision movements and alignments to prevent damage to the fragile wafers. Wafer retrieval and transfer are subject to damaging wafers. The handling mechanism has five vacuum tweezers disposed vertically. The longitudinal distance between tweezers is the same pitch increment that separates the wafers in the cassette stocker and the firing receptacle. During the handling operation, the tweezers are introduced between the wafers for inserting or pulling them into or out of their respective holders. During the handling operation and after many cycles of use, the spacing between tweezers may change because of loose fasteners or damaged and displaced tweezer blades. When this comes about, mechanical interference between the handling mechanism and wafers causes damage to both product and equipment. The prior art has failed to provide means to detect or to prevent damage to wafers and to apparatus caused by tweezer misalignment.

SUMMARY OF THE INVENTION

In light of the foregoing concerns, it is a first object of the present invention to provide an effective method for checking the alignment between a wafer tweezer apparatus and a wafer holding receptacle in preparation for the wafer handling operation for CVD/diffusion.

It is a second object of the present invention to provide a method wherein the apparatus is mounted within the framework of the CVD/diffusion furnace and integrated into the control domain of the wafer handler.

In accordance with the object of this invention, a new method for checking the alignment between the transfer tweezers and the wafer's receptacles has been achieved. A precision mechanical go-no go gage that is mountable inside the CVD/diffusion furnace as a check point and within reach of the tweezer's wafer insertion stroke. If there is a need for calibration, the handling unit will take the tweezers to the check point, insert the tweezers into the go-no go position gage and visually indicate a go or a no go condition. If a no go condition exists, the handler will take the tweezers to an accessable position for repair.

DETAILED DESCRIPTION OF THE PREFERRED EMBODIMENT

Figure 1:
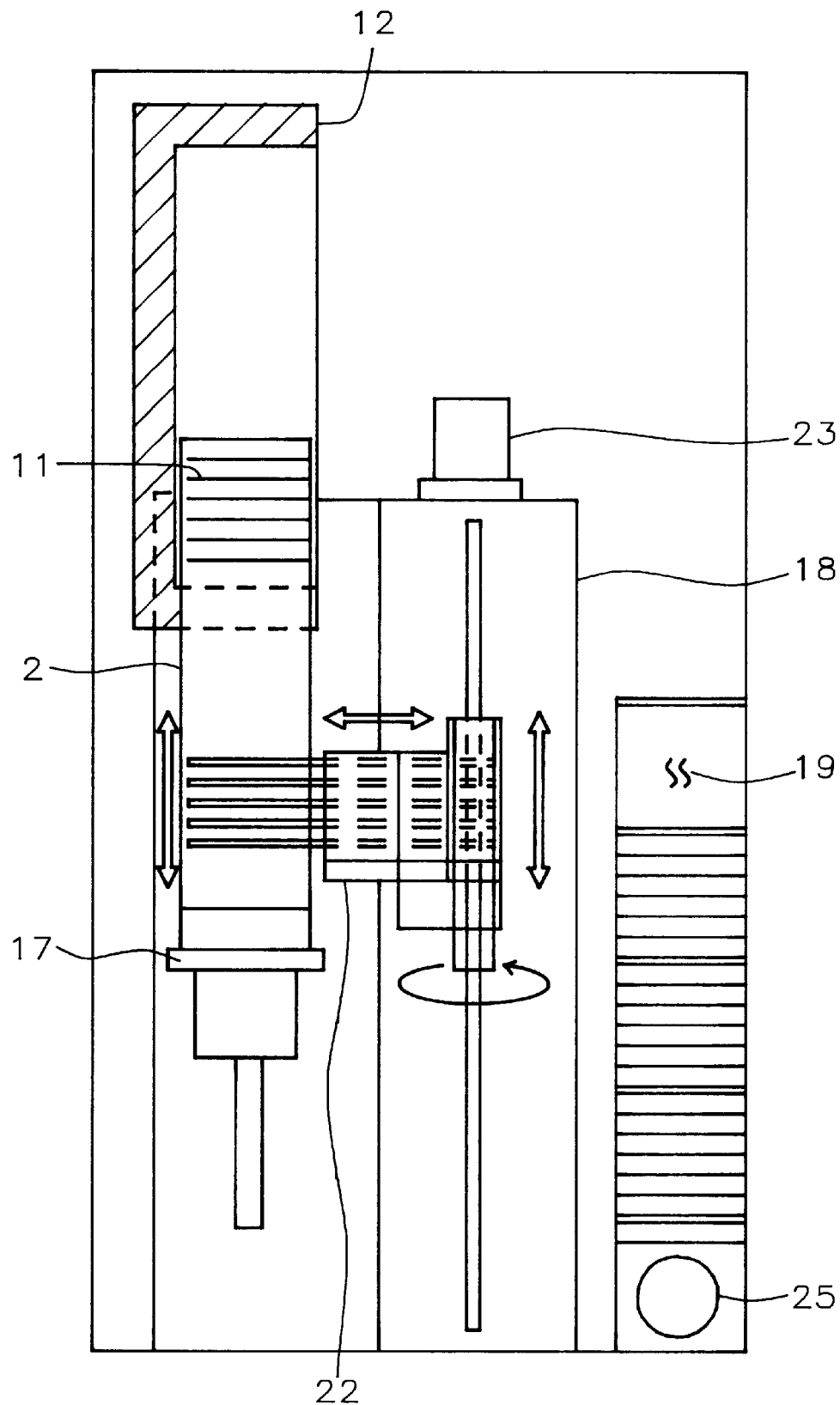
FIG. 1 is a side elevation view of the prior art's vertical CVD/diffusion station illustrating the wafer transfer/handling apparatus and the wafer cassette storage compartments.

Referring to the drawings and especially FIG. 1, there is depicted a typical vertical CVD/diffusion apparatus which usually includes a wafer handler. The CVD/diffusion apparatus consists of a furnace 12, a load-unload elevator 17, a transfer elevator 18, and a wafer cassette storage compartment 19. The load-unload elevator 17 carries a diffusion boat 2 to be loaded with wafers by handling unit 22. Wafers stored in the storage compartments are separated having a vertical spacing that is equal to the spacing of the diffusion boat 2. The transfer elevator 18 has a handling unit 22 that is adapted to translate up and down in response to the driving of elevating motor 23.

Figure 2:
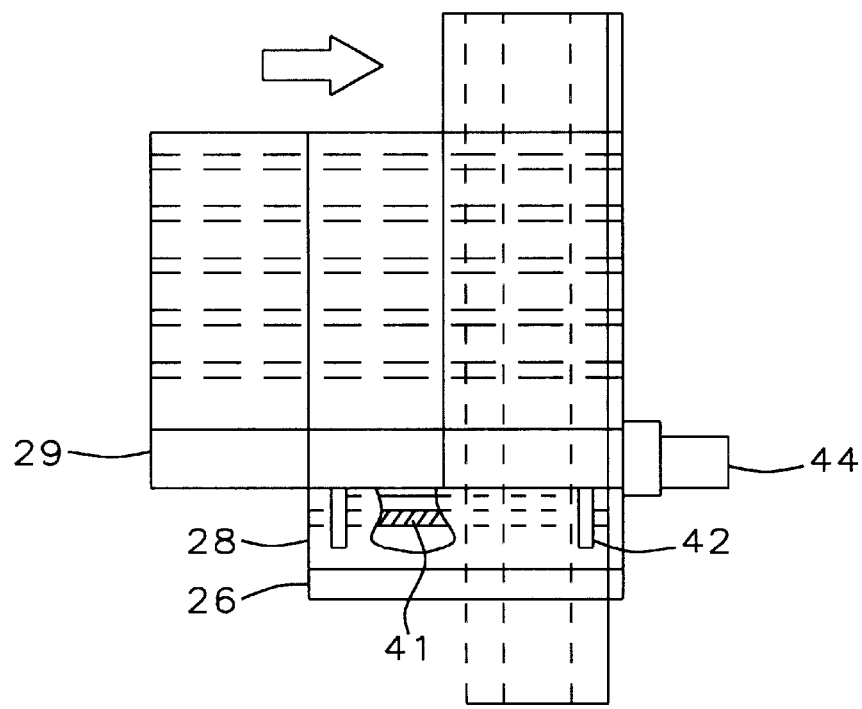
FIG. 2 illustrates a side view of the prior art's wafer transfer apparatus showing the tweezers retracted.
Figure 3:
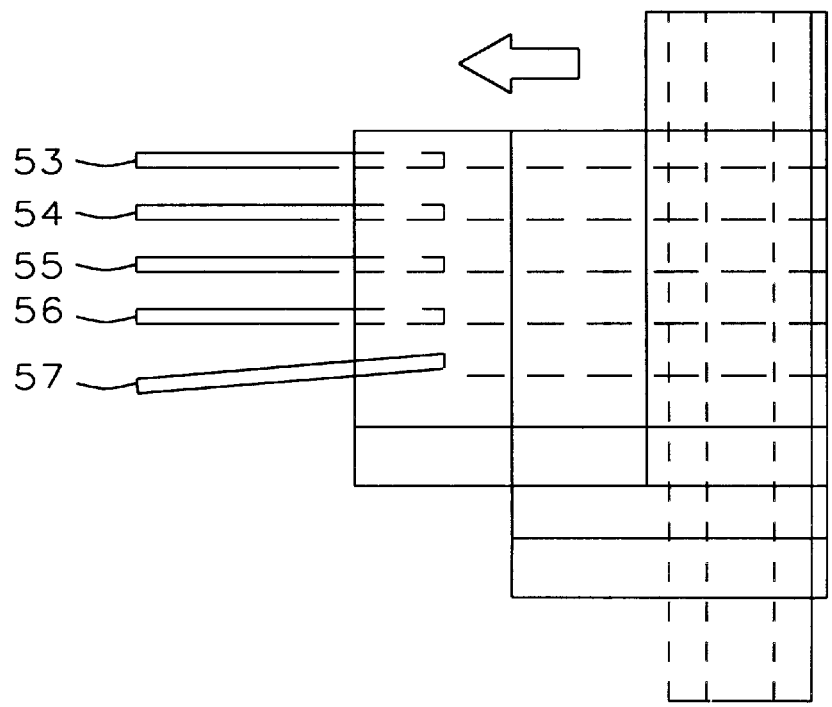
FIG. 3 illustrates a side view of the prior art's wafer transfer apparatus showing the tweezers extended.

Refering now to FIGS. 2 and 3, the prior art's handling unit is an integral assembly of the wafer transfer device consisting of slide mechanism 28, base plate 26, and wafer chuck 29 which is attached to horizontal slider 42. Wafer chuck 29 has five vacuum tweezers 53,54,55,56, and 57 each having the same longitudinal spacing as the aforementioned wafer receptacles 2 and 19.

During the wafer transfer operation, the handling unit 22 removes scheduled wafers 11 from the cassette storage compartment 19 and transfers them in a predetermined sequence to boat 2. More specifically, the handling unit 22 traverses to the previously scheduled cassette storage address containing the particular wafers 11 to be processed. The handling unit is driven by the rack transverse traveling motor 25 and the elevating motor 23. When the correct address is recognized, slide motor 44 rotates the lead screw 41 to position the tweezers 53,54, 55,56, and 57 of the wafer chuck 29 between five wafers (or less), which correspond to that particular address. After applying vacuum, the wafers are held against the top planes of each of its corresponding tweezer by vacuum. The slide motor 44 is then driven to reverse the direction of the horizontal slider 42 thereby removing the stored wafers from the cassette 19. The handling unit 22 is rotated about the vertical axis from the cassette storage area 19 towards the diffusion boat 2, refer to FIG. 6c and 6d. The elevating motor 23 lifts the handling unit 22 in vertical alignment with the diffusion boat. The slide motor 44 advances the wafer chuck 29 to insert the wafers into boat 2, vacuum hold is released, the slide motor 44 reverses and withdraws chuck 29 leaving the wafers in the boat 2. FIGS. 6a thru 6f illustrate this wafer transfer sequence. The sequence is reversed when removing wafers from boat 2 and loaded back into the storage cassettes 7.

After many repeated cycles, any one fastener holding and clamping the tweezers 53,54,55,56, and 57 in place may become loose thereby causing a tweezer to lose its dimensional pitch tolerance as best illustrated by tweezer 57 in FIG. 3. A loose tweezer can cause considerable damage to both wafers and equipment.

Figure 4:
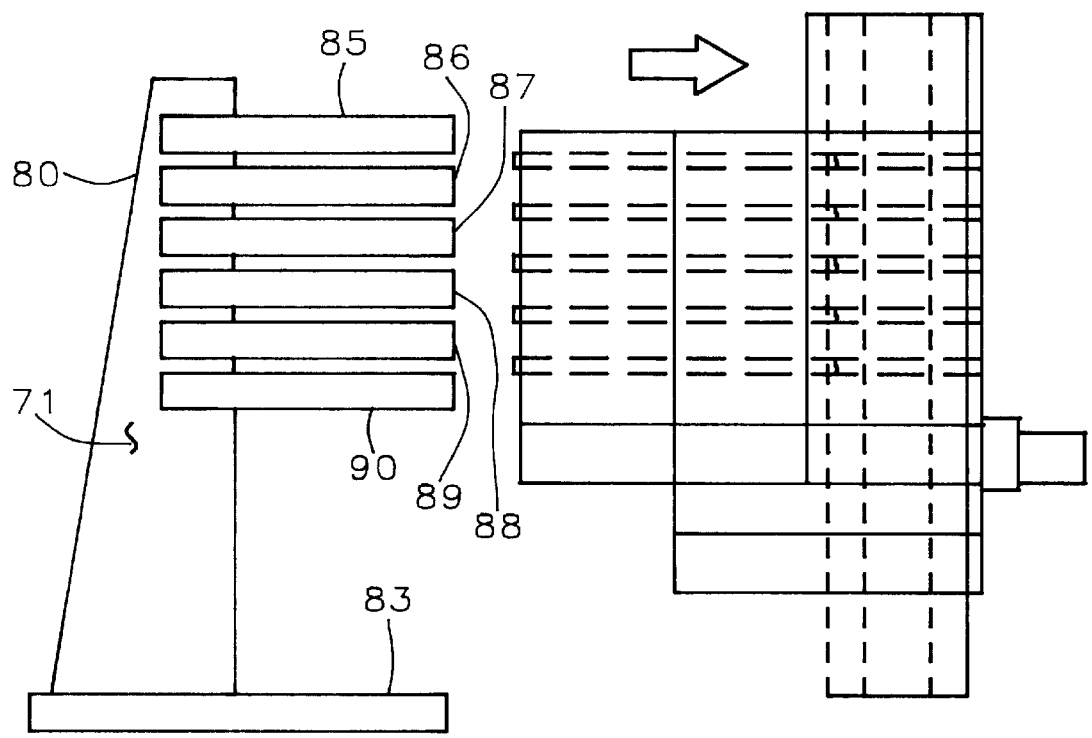
FIG. 4 is a side elevation view of the go-no go checker illustrating the vertical plurality of retracted tweezers relative to the gaged spaces of the checker.
Figure 5:
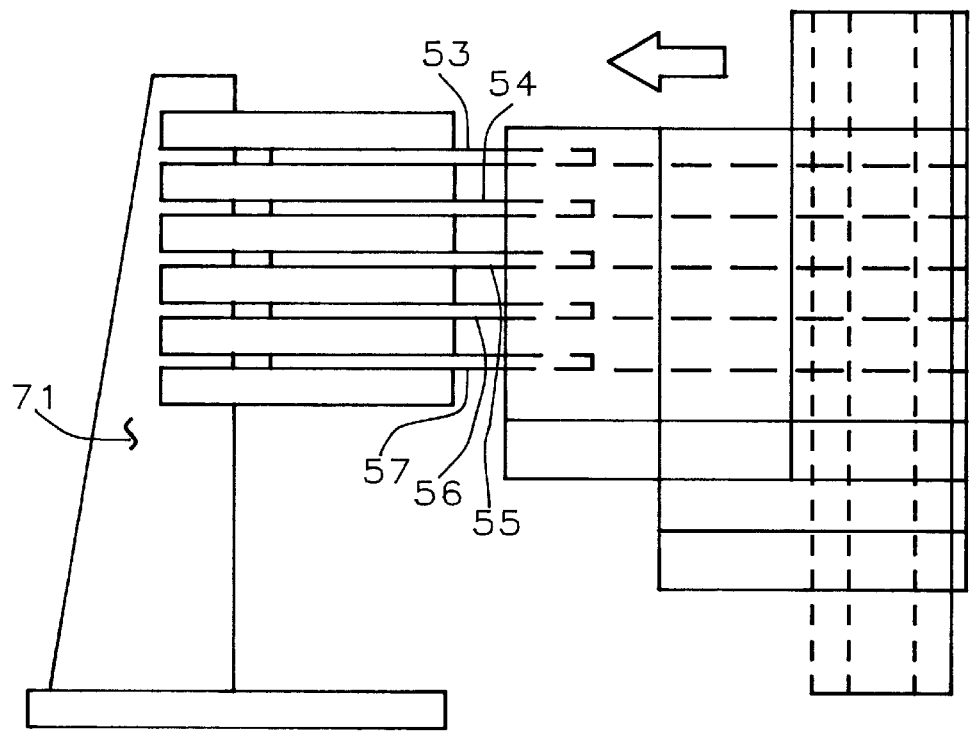
FIG. 5 is a side elevation view of the go-no go checker illustrating the vertical plurality of extended tweezers between the corresponding gaged spaces of the checker.
Figure 6A:
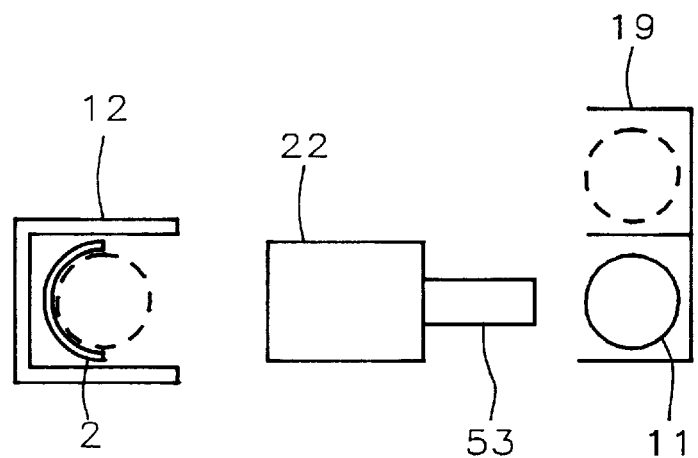
FIG. 6 is a diagrammatic depiction of the wafer transfer sequence as observed from above.
Figure 6B:
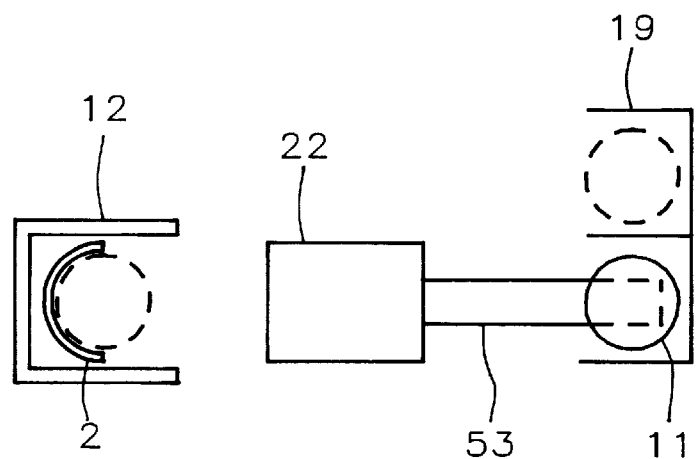
Figure 6C:
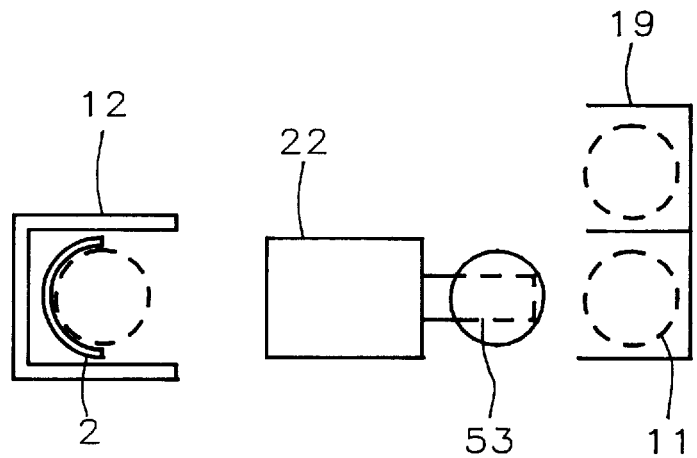
Figure 6G:
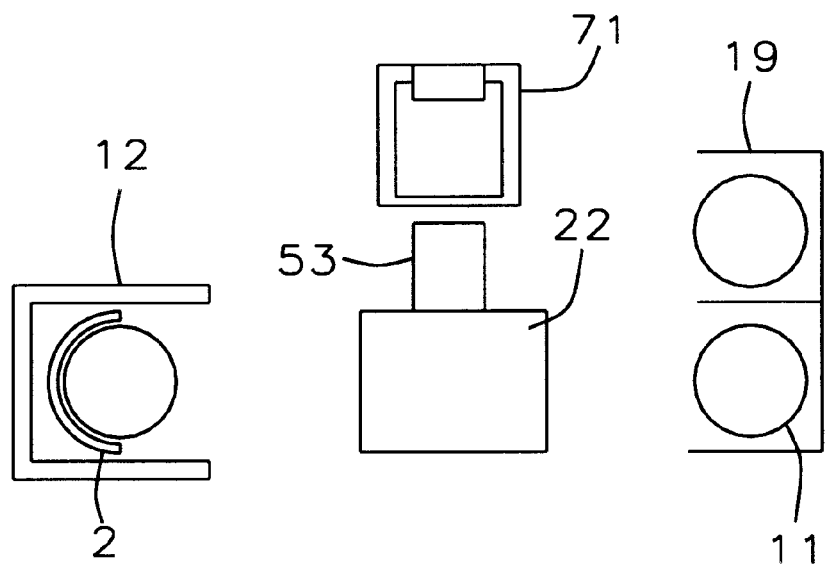
Figure 6H:
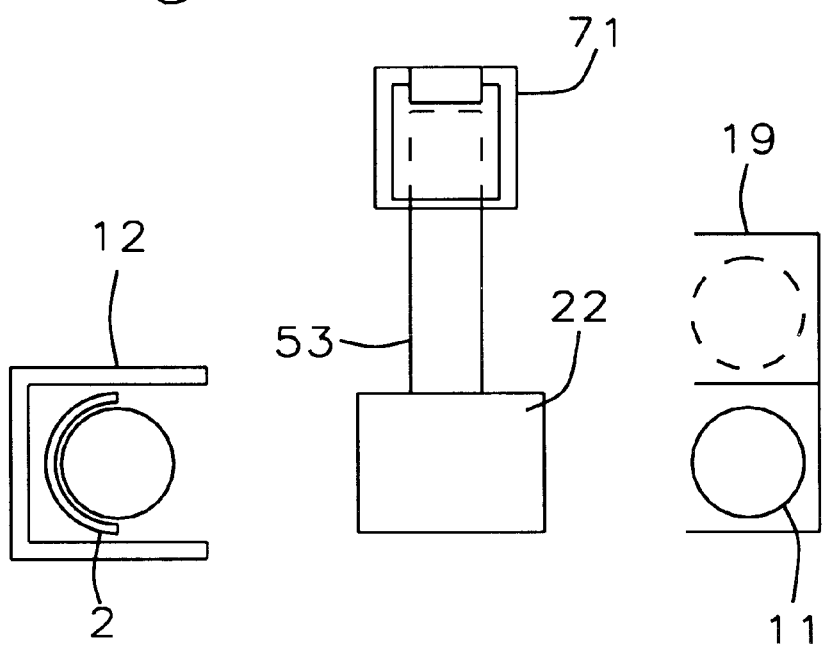

In FIGS. 4 and 5 there is illustrated more or less schematically one form of a go-no go gage. Since the tweezers 53,54,55,56, and 57 are in a comb-like form factor, then a comb-like go-no go gage 71 is provided to calibrate the positions of the tweezers 53,54,55,56, and 57. The present invention consists of a stand 80, a base 83, gage members, 85,86,87,88,89, and 90 that are spaced and mounted parallel to each other, forming a comb-like outer periphery. The thickness of each gage member corresponds to the vertical space between the tweezers. The space between each gage member corresponds to the vertical thickness of a tweezer. The space between each gage member is precalibrated and conforms to the tweezer specification. The position of the tweezers 53,54,55,56, and 57 can be examined by inserting the tweezers into the spaces between the gage members 85,86,87,88,89, and 90. If the tweezers are at the correct locations and conform to the tweezer specification, they will easily insert into the spaces between the gage members without making contact. If a tweezer becomes loose, it will invaribly interfere with one of the gage members and be visibly evident and in need of calibration.

The go-no go gage can be permanently fixed at a location inside the diffusion furnace and placed where the tweezers can extend and reach. If there is a need for calibration, the handling unit 22 can take the tweezers to the check point, insert the tweezers into the spaces of the go-no go gage. Interference is easily visable or detectable using electronic transducers.

While the invention has been particularly shown and described with reference to the preferred embodiments thereof, it will be understood by those skilled in the art that various changes in form and details may be made without departing from the spirit and scope of the invention.

What is claimed is:

1. A gaging apparatus for checking spaces separating a plurality of handling elements, the handling elements used for transferring planar objects to and from a vertical holding receptacle, the gaging apparatus comprising:

a vertical stand;

gage members mounted horizontally to said vertical stand to form a comb-like structure relative to said vertical stand;

said vertical stand having a number of gage members to interleave and surround said plurality of handling elements;

a base support for said vertical stand;

said gaging apparatus fixidly placed within a CVD diffusion furnace system and within a movement path of said plurality of handling elements;

said plurality of handling elements each having its own vacuum circuit for holding planar objects;

means for moving the plurality of handling elements into position facing the gaging apparatus;

means for automatically inserting into an interleaved position relative to said gage members, and withdrawing the plurality of handling elements to periodically check the spaces between the handling elements.

2. The gaging apparatus of claim 1 wherein said plurality of handling elements slidably fit into sized spaces between said horizontal gage members.

3. The gaging apparatus of claim 2 further comprising a plurality of electrical means for sensing interference between any one of said plurality of handling elements and a corresponding horizontal gage member.

4. A method for periodically checking spaces separating a plurality of handling elements that are used for transferring wafers into and out of vertical holding receptacles in a semiconductor process, comprising the steps of:

providing a CVD wafer processing system including an automatic wafer transport having said plurality of handling elements, said wafer transport moving in a prescribed path;

providing space for a checking station within a prescribed handling path of said wafer transport, said checking station includes a gaging apparatus that is fixedly mounted, said gaging apparatus having a plurality of gage members, each said gage member provided with electronic sensing means;

moving the plurality of handling elements by the wafer transport to the checking station;

inserting the plurality of handling elements to fit interleaved with said gaging members;

if any one of said electronic means senses a handling element does not fit between said gaging members said handling elements are moved by the wafer transport to a docking station for maintenance and recalibration;

after recalibration, said handling elements are moved back by the wafer transport to the checking location, and reinserting said handling elements to fit interleaved with said gaging members, whereby a switch closure automatically qualifies use of said handling elements for the transfer of wafers to and from holding receptacles.

5. The method of claim 4 wherein said handling elements fit interleaved with said gaging members but interfere with a holding receptacle, thereby, suggesting a position error between said wafer transport and a holding receptacle.

* * * * *